United States Patent [19]

Inoue et al.

[11] Patent Number: 5,251,014
[45] Date of Patent: Oct. 5, 1993

[54] CIRCUIT FOR DETECTING PHASE ERROR OF COLOR BURST SIGNAL

[75] Inventors: Takashi Inoue, Osaka; Nobuyuki Ogawa, Takatsuki; Hiromu Kitaura, Osakasayama; Tokikazu Matsumoto; Fumiaki Koga, both of Osaka, all of Japan

[73] Assignee: Matsushita Electric Industrial Co., Ltd., Osaka, Japan

[21] Appl. No.: 894,277

[22] Filed: Jun. 4, 1992

[30] Foreign Application Priority Data

Jun. 4, 1991 [JP] Japan ................. 3-132568

[51] Int. Cl.⁵ .............................................. H04N 9/45
[52] U.S. Cl. ....................................... 358/19; 358/20
[58] Field of Search ...................... 358/19, 20, 17, 13, 358/148, 150, 158, 320, 339, 337

[56] References Cited

U.S. PATENT DOCUMENTS

| | | | |
|---|---|---|---|
| 4,393,413 | 7/1983 | Kaneko | 358/19 |
| 4,636,836 | 1/1987 | Steckler et al. | 358/19 |
| 4,675,724 | 6/1987 | Wagner | 358/19 |
| 4,719,505 | 1/1988 | Katznelson | 358/19 |
| 4,797,730 | 1/1989 | Smith | 358/19 |

FOREIGN PATENT DOCUMENTS 2081050  2/1982  United Kingdom ................. 358/19

Primary Examiner—James J. Groody
Assistant Examiner—Michael H. Lee
Attorney, Agent, or Firm—Wenderoth, Lind & Ponack

[57] ABSTRACT

In a phase error detector for detecting a phase error $\theta$ of an input color burst signal from a phase of a reference signal from $\sin\theta$ component and $\cos\theta$ component, if either one of the $\sin\theta$ component and $\cos\theta$ component requires M bits for its expression, the both values are divided by a same value to shift in bits to be expressed in N bits (N<M), thereby preventing the subsequent circuit from increasing in scale.

4 Claims, 3 Drawing Sheets

CIRCUIT FOR DETECTING PHASE ERROR OF COLOR BURST SIGNAL

BACKGROUND OF THE INVENTION

1. Field of the Invention

This invention relates to a phase error detector for detecting a phase error of a color burst signal in a video signal reproduced from a recording medium.

2. Description of the Prior Art

In a conventional color burst signal phase error detector, a reproduced color burst signal in a digital video signal is assumed to have a sine wave, and a phase error $\theta$ from a reference signal is determined. In such phase error detector, using two sampling pulses differing in phase by 180 degrees from each other in a period of ½ of color burst signal, the reproduced color burst signal is integrated in several cycles to eliminate the effects of noise, and sin $\theta$ component and cos $\theta$ component are obtained. Then, arc-tangent is determined by tan $\theta$ = sin $\theta$/cos $\theta$, thereby obtaining the phase error $\theta$.

In this method, if the signal amplitude of the reproduced color burst signal is increased due to difference in the transmission characteristic of the recording system, reproducing system and transmission system, the integrating circuit for noise removal overflows. If either the sine component or the cosine component overflows, the phase error $\theta$ cannot be obtained accurately.

If the number of bits of the integrating circuit is increased in order to prevent overflow, the circuit scale is extremely increased.

SUMMARY OF THE INVENTION

It is hence a primary object of the invention to present a phase error detector capable of determining accurately a phase error between a reproduced color burst signal and a reference signal without increasing the circuit scale, even if the amplitude of the reproduced color burst signal is increased.

To achieve the above object, the invention presents a phase error detector comprising means for differentiating sampled data of a digital video signal at sampling points apart from each other by ½ period of a reference color burst signal to obtain a differential signal, means for generating a first sampling pulse of a frequency twice as high as a frequency of the reference color burst signal, first integrating means for obtaining a first integral signal of M bits (M being a positive number) by integrating the differential signal by the first sampling pulse, means for generating a second sampling pulse which is the same in frequency as and different in phase by 180 degrees from the first sampling pulse, second integrating means for obtaining a second integral signal of M bits by integrating the differential signal by the second sampling pulse, means for obtaining a first N-bit integral signal by reducing the number of bits of the first integral signal of M bits to N bits (N being a positive number, N<M), means for obtaining a second N-bit integral signal by reducing the number of bits of the second integral signal of M bits to N bits, dividing means for dividing the first N-bit integral signal by the second N-bit integral signal, and means for obtaining an arc-tangent of an output of the dividing means.

In this constitution, by converting two integral signals of M bits into integral signal of N bits, and by executing dividing operation of the signals of N bits in the dividing circuit, the phase error of color burst signal can be detected accurately.

DESCRIPTION OF THE PREFERRED EMBODIMENT

Figure 1:
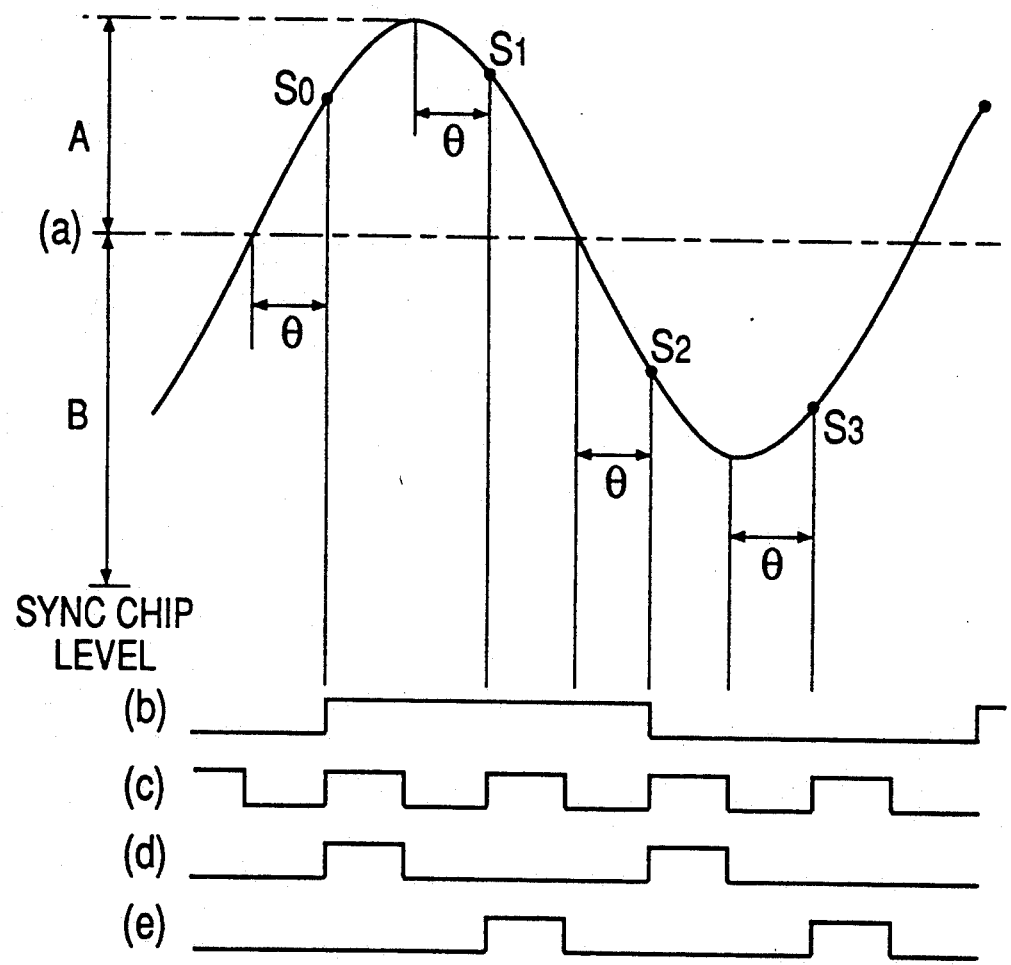
FIG. 1 is a waveform diagram showing the principle of color burst signal phase error detection.

The waveform in FIG. 1 represents the principle of detection of a color burst signal phase error. Supposing a reproduced color burst signal (a) to be a sine wave, a phase error $\theta$ from the leading edge of a reference color burst signal (b) is determined.

The reproduced color burst signal (a) is sampled by a clock pulse (c) at a frequency four times as high as that of the reference color burst signal (b). Therefore, the sampling points per one cycle wave of the color burst signal are four points, S0, S1, S2, S3. Supposing the blanking level to be B and the amplitude of the color burst signal to be 2 A, the amplitude at each sampling point can be expressed as follows:

$S0 = B + A \sin \theta$ $S1 = B + A \cos \theta$ $S2 = B - A \sin \theta$ $S3 = B - A \cos \theta$ From these, the following differences can be obtained:

$(S0 - S2) = 2 A \sin \theta$ $(S1 - S3) = 2 A \cos \theta$

Since these differences are sine component and cosine component, respectively, the following relation can be obtained:

$$(S0 - S2)/(S1 - S3) = \sin\theta/\cos\theta = \tan\theta$$

Figure 4:
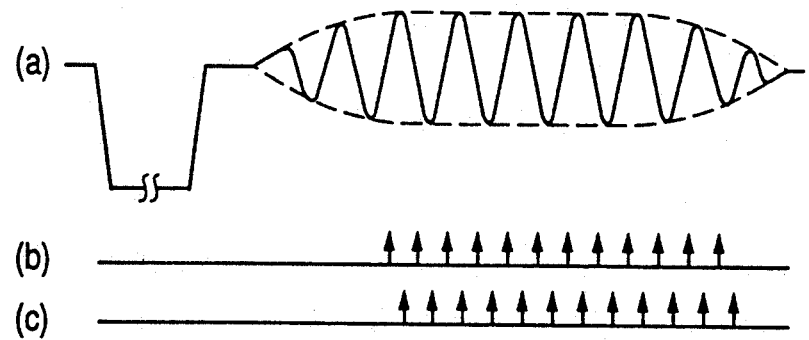
FIG. 4 is a waveform diagram showing integration pulse generation timing.

Therefore, the phase error $\theta$ is known by calculating $\tan^{-1}\{(S0-S2)/(S1-S3)\}$. That is, the amplitude difference is obtained at every other sampling point, and the arc-tangent is determined by dividing the sine component by cosine component. To decrease reduction of the error detection precision due to effects of noise or the like, the integration may be executed for m cycles (m being a positive number) of color burst signal, so that the sine component becomes 2 mA sin $\theta$ and the cosine component is 2 mA cos $\theta$. Usually, the color burst signal lasts for about 9 cycles, but since the frequency band is limited in the recording system, reproducing system and transmission system, the amplitude is lowered at the front end and rear end as shown in FIG. 4 (a), where the S/N deteriorates. Therefore, 6 or 7 cycles of only the central part of the color burst signal are sampled and integrated, so that the front end and rear end may not be used in detection of phase error.

Figure 2:
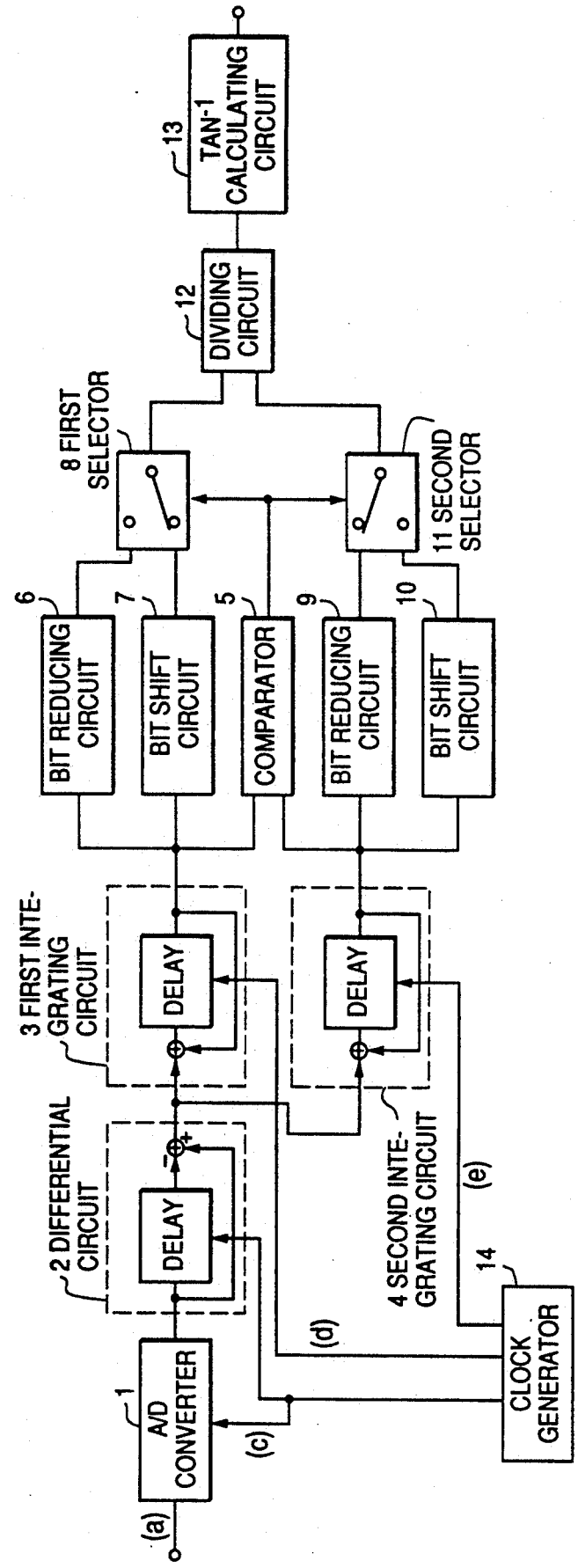
FIG. 2 is a block diagram of a phase error detector in an embodiment of the invention.

FIG. 2 is a block diagram showing an embodiment of a phase error detector of the invention. An input analog video signal (a) is first digitized in an A/D converter 1. From the digitized video signal, a differential signal is obtained in a differential circuit 2. The differential signal is integrated in integrating circuits 3 and 4. The outputs of the integrating circuits 3 and 4 are fed into a comparator 5 which compares the magnitudes of the two. The outputs of the integrating circuits are also fed to bit reducing circuits 6 and 9 for reducing bits. In addition, the outputs of the first and second integrating circuits are shifted in bits by bit shift circuits 7 and 10. The outputs of the bit reducing circuits 6 and 9 and the outputs of the bit shift circuits 7 and 10 are selected in first and second selectors 8 and 11. The output of the first selector 8 is divided by the output of the second selector 11 in a dividing circuit 12, and the result is fed to a $\text{Tan}^{-1}$ calculating circuit 13 in order to obtain an arc-tangent value. The reference color burst signal as the basis for detecting the phase error, the sampling pulse of the A/D converter, and the integration pulse for determining the sine component and cosine component are generated by a clock generator 14.

Figure 3:
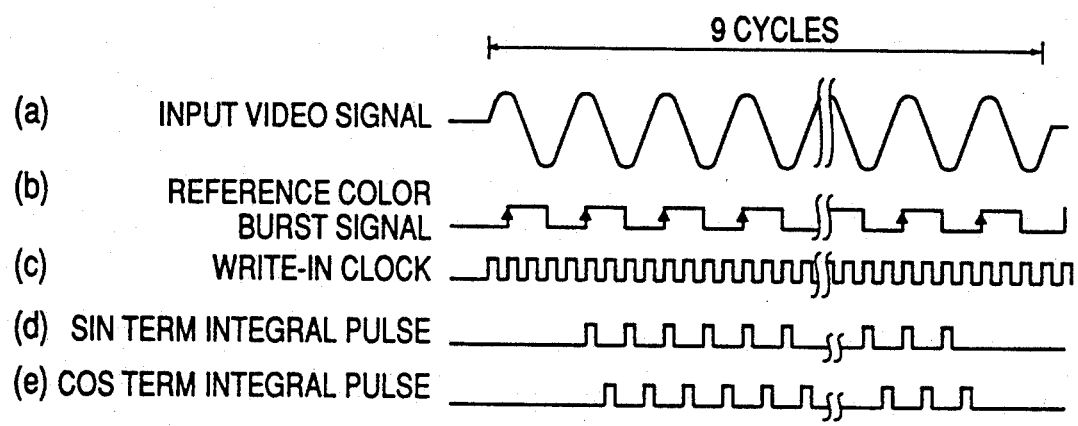
FIG. 3 is a waveform diagram showing the operation of the phase error detector shown in FIG. 2.

In the thus composed phase error detector of the invention, the operation is described below while referring to the waveform diagram in FIG. 3.

The input video signal (a) is converted into an 8-bit digital signal in the A/D converter 1 by the write-in clock pulse (c) (period T) having a frequency of four times as high as a frequency of the reference color burst signal (b) generated in the clock generator 14. Afterwards, the difference between a sample and a sample 2 T before is obtained in the differential circuit 2 as a differential signal.

To determine the sine component and cosine component, in the first and second integrating circuits 3 and 4, the differential signal is integrated respectively by a sine term integration pulse (d) and a cosine term integration pulse (e). The sine term integration pulse (d) is a pulse generated at phases of 0 degree and 180 degrees of the reference color burst signal, and the cosine term integration pulse (e) is a pulse generated at 90 degrees and 270 degrees of the reference color burst signal.

The sine component is latched by the leading edge of the sine term integration pulse (d), delayed and fed back positively to be integrated. The cosine component is latched by the leading edge of the cosine term integration pulse (e), delayed and fed back positively to be integrated.

Usually, the composite video signal is transmitted so that the IRE scale of the white level from the sync chip level is 140 IRE, from $-40$ to $+100$ IRE.

In the case of A/D conversion of composite video signal in L bits, considering the allowance for chroma component, for example, 160 IRE is converted into a digital signal of $2^L$ steps.

In the case of A/D conversion in 8 bits (256 steps), since the amplitude of AC component of color burst signal corresponds to 40 IRE, it results in 64 steps after A/D conversion. In the differential output, the DC component is canceled, and the AC component is doubled to be 128 steps. Supposing such a data is subjected to 6-cycle integration, it becomes 768 steps, which can be expressed in 10 bits (1024 steps). When expressing the integral signal in 10 bits, it follows that $1024/768=$ approx. 1.33, and the allowance for increase of color burst signal amplitude is 33%. Actually, however, the amplitude may increase by 50% or more depending on the cutting condition of the master video disk, frequency characteristic in the player reproducing system, and so on. At this time, if the integrating circuit is set at 10 bits, the integrating circuit may overflow, so that the phase error of the color burst signal may not be detected correctly. Accordingly, the first and second integrating circuits 3, 4 are each composed in 11-bit feedback loop structure so that they will not overflow unless the amplitude of the input color burst signal becomes 2.67 times ($=2^{11}/768$).

However, if division operation of the sine component by the cosine component are carried out in 11 bits, the circuit scale and operation time of the dividing circuit 12 must be increased.

Therefore, when the integral signal can be expressed in 10 bits or less, that is, from $-512$ to $+511$, the number of bits may be reduced to 10. When the integral signal is a complement of 2, or expressed in an offset binary notation, the second from the MSB of the 11-bit signal may be removed to obtain a 10-bit signal. That is, the number of bits can be reduced without varying the value.

If the integral signal cannot be expressed within 10 bits, that is, $-513$ or less or $+512$ or more, the integral signal may be divided by 2. That is, by removing the LSB and shifting to the lower direction by 1 bit, the signal can be expressed in 10 bits.

When both output integral signals from the first and second integrating circuits 3 and 4 can be expressed in 10 bits or less, the both outputs are reduced in bits in the former manner to be 10 bits, and if either one cannot be expressed in 10 bits or less, the both outputs are shifted by 1 bit to be $\frac{1}{2}$ in the lather manner so as to be expressed in 10 bits.

When the sine component and cosine component, which are respectively numerator and denominator of the division, are both processed in the same manner, the result of the division is unchanged.

Whether the integral signal can be expressed in 10 bits or less or not is judged by the comparator 5. The judgement output of the comparator is, for example, 0 when the both integral signals are expressed in 10 bits or less, and 1 when at least either one requires 11 bits.

The two integral signals are set at 10 bits in two methods individually in the bit reducing circuits 6, 9 and bit shift circuits 7, 10. Each of the first and second selectors 8 and 11 select either one of the outputs of the corresponding bit reducing circuit and bit shift circuit connected thereto on the basis of the judgement result of the comparator 5. That is, the output of the bit reducing circuit is selected if the judgement result is 0, and the output of the bit shift circuit is selected if the judgement result is 1.

In the divider 12, the 10-bit sine component is divided by the 10-bit cosine component to obtain a value of tan $\theta$. In the $\text{Tan}^{-1}$ calculating circuit 13, referring to a built-in ROM table for tan $\theta$ value, the value of $\theta$ is determined.

In this embodiment, specifically, it is explained to perform A/D conversion in 8 bits and division in 10 bits by changing 11-bit integral signal into 10-bit signal, but it may be generally expressed to perform A/D conversion in L bits (L being a positive number) and division in N bits by changing M-bit integral signal into N-bit signal.

When both of the two integral signals can be expressed in N bits, they are reduced to N bits by removing (M−N) bits from the upper second bit position.

If at least one of the integral signals cannot be expressed in N bits, each signal is shifted to N bits after removing (M−N) bits from the LSB.

Thus, according to the embodiment, if at least one of the two integral signals expressed in M bits cannot be expressed in N bits, the output of the bit shift circuit is selected, while the output of the bit reducing circuit is selected when the both integral signals can be expressed in N bits or less. Therefore, even if the amplitude of the input video signal is increased and the integral signal cannot be expressed in N bits, the dividing circuit executes a division operation of signals of N bits, so that the phase error of color burst signal can be detected correctly.

What is claimed is:

1. A phase error detecting circuit for detecting a phase error of a color burst signal of a video signal, comprising:

means for differentiating a digital video signal at sampling points apart from each other by $\frac{1}{2}$ period of a reference color burst signal to obtain a differential signal;

means for generating a first sampling pulse of a frequency twice as high as a frequency of the reference color burst signal;

first integrating means for obtaining a first integral signal of M bits (M being a positive number) by integrating the differential signal by the first sampling pulse;

means for generating a second sampling pulse which is the same in frequency as and different in phase by 180 degrees from the first sampling pulse;

second integrating means for obtaining a second integral signal of M bits by integrating the differential signal by the second sampling pulse;

first converting means for obtaining a first N-bit integral signal by reducing the number of bits of the first integral signal of M bits to N bits (N being a positive number, N<M);

second converting means for obtaining a second N-bit integral signal by reducing the number of bits of the second integral signal of M bits to N bits;

dividing means for dividing the first N-bit integral signal by the second N-bit integral signal; and means for obtaining an arc-tangent of an output of the dividing means.

2. A circuit according to claim 1, wherein each of the first and second converting means includes means for reducing the number of bits of an M-bit signal into N bits without varying a value of the signal.

3. A circuit according to claim 1, wherein each of the first and second converting means includes means for multiplying an M-bit signal by $\frac{1}{2}^{(M-N)}$ to obtain an N-bit signal.

4. A circuit according to claim 1, further comprising a detecting means for detecting whether at least one of the first and second integral signals possesses a value exceeding a value that can be expressed in N bits or not and producing a detection signal showing a result of detection, wherein each of the first and second converting means comprises a first bit reducing means for reducing the number of bits of an M-bit signal into N bits without varying a value thereof, a second bit reducing means for reducing the number of bits of the M-bit signal into N bits by multiplying by $\frac{1}{2}^{(M-N)}$, and a selection means responsive to said detection signal for selecting an output signal of the second bit reducing means when at least one of the first and second integral signals possesses a value exceeding the value that can be expressed in N bits and an output signal of the first bit reducing means otherwise.

* * * * *